United States Patent
Ito et al.

(10) Patent No.: US 7,733,664 B2
(45) Date of Patent: *Jun. 8, 2010

(54) ELECTRONIC COMPONENT MOUNTING STRUCTURE

(75) Inventors: Atsushi Ito, Chiryu (JP); Takayoshi Honda, Kariya (JP); Hidehiro Mikura, Kariya (JP); Tadashi Tsuruzawa, Chiryu (JP); Takuya Sakuta, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/155,947

(22) Filed: Jun. 12, 2008

(65) Prior Publication Data

US 2008/0253096 A1    Oct. 16, 2008

Related U.S. Application Data

(63) Continuation of application No. 11/707,958, filed on Feb. 20, 2007, now Pat. No. 7,400,511.

(30) Foreign Application Priority Data

Feb. 20, 2006   (JP)   .............................. 2006-043109
Sep. 5, 2006   (JP)   .............................. 2006-240733

(51) Int. Cl.
*H05K 1/11*   (2006.01)

(52) U.S. Cl. ...................... 361/784; 174/262; 174/264; 361/758

(58) Field of Classification Search ................. 361/784, 361/758; 174/262, 264
See application file for complete search history.

(56) References Cited

U.S. PATENT DOCUMENTS

| 4,583,807 | A | | 4/1986 | Kaufman et al. |
| 5,398,166 | A | * | 3/1995 | Yonezawa et al. ........... 361/784 |
| 6,049,039 | A | | 4/2000 | Fushimi |
| 6,081,998 | A | | 7/2000 | Terauchi et al. |
| 6,369,333 | B1 | * | 4/2002 | Yee .............................. 174/261 |

(Continued)

FOREIGN PATENT DOCUMENTS

JP        U-59-84831        6/1984

(Continued)

OTHER PUBLICATIONS

Office Action dated Jun. 3, 2009 from Europe Patent Office in the corresponding EP Application No. 07002961.6 (and English Translation).

*Primary Examiner*—Jinhee J Lee
*Assistant Examiner*—Andargie M Aychillhum
(74) *Attorney, Agent, or Firm*—Posz Law Group, PLC

(57)    ABSTRACT

An electronic component mounting structure includes a board and an electronic component mounted on a surface of the board. The board includes lands. The electronic component includes a body and terminals extending from the body. Each terminal is electrically connected to a corresponding one of the lands of the board. The terminal has a first terminal portion extending along the surface of the board and a second terminal portion extending toward the surface of the board. Each land includes a land portion electrically soldered to the first terminal portion and a blind hole for receiving the second terminal portion. The first terminal portion is soldered to the land portion in a reflow process under the condition that the second terminal portion is inserted in the blind hole.

7 Claims, 11 Drawing Sheets

U.S. PATENT DOCUMENTS

| | | |
|---|---|---|
| 6,443,557 B1 | 9/2002 | Pan et al. |
| 6,655,990 B2 | 12/2003 | Terauchi et al. |
| 6,837,736 B2 | 1/2005 | Seltz |
| 6,866,524 B2 | 3/2005 | Takata |
| 2004/0251046 A1 | 12/2004 | Mickievicz et al. |
| 2005/0155791 A1 | 7/2005 | Saiki |

FOREIGN PATENT DOCUMENTS

| | | |
|---|---|---|
| JP | A-07-153508 | 6/1995 |
| JP | A-9-51160 | 2/1997 |
| JP | A-10-041605 | 2/1998 |
| JP | A-11-317265 | 11/1999 |
| JP | A-2000-100508 | 4/2000 |

* cited by examiner

ELECTRONIC COMPONENT MOUNTING STRUCTURE

CROSS REFERENCE TO RELATED APPLICATION

This application is a continuation of application Ser. No. 11/707,958 filed on Feb. 20, 2007, now issued as U. S. Pat. No. 7,400,511, which is based on and incorporates herein by reference Japanese Patent Applications No. 2006-43109 filed on Feb. 20, 2006 and No. 2006-240733 filed on Sep. 5, 2006, This application incorporates the contents of U.S. application Ser. No. 11/707,958 by reference.

FIELD OF THE INVENTION

The present invention relates to an electronic component mounting structure.

BACKGROUND OF THE INVENTION

In a conventional through-hole mounting structure, terminals of an electronic component are inserted in holes drilled in a printed circuit board and soldered to both walls of the holes and lands formed around openings of the holes by solder. Thus, the electronic component is electrically connected to the printed circuit board. Since the terminals of the electronic component pass through the through holes and are exposed to the back surface of the printed circuit board, other electronic components cannot be mounted to the back surface area having the though holes. Therefore, the through-hole mounting structure limits circuit density of the printed circuit board.

In a blind-hole mounting structure disclosed in JP-H10-41605A, terminals of an electrical component are inserted in blind holes drilled in a printed circuit board. Since the terminals of the electronic component are not exposed to the back surface of the printed circuit board, other electronic components can be mounted to the back surface area having the blind holes. Therefore, the blind-hole mounting structure allows high circuit density of the printed circuit board compared to the through-hole mounting structure.

However, the blind-hole mounting structure reduces contact area between the terminals and solder compared to the through-hole mounting structure. Therefore, temperature change (i.e., difference in the linear coefficient of expansion) or application of external force causes a large stress per unit area on junctions between the terminals of the electronic component and the lands of the printed circuit board. The large stress damages the junctions so that connection reliability between the terminals and the lands may be reduced.

In a conventional surface mounting structure, terminals of an electrical component are bent along a front surface of a printed circuit board and soldered to lands formed on the front surface of the printed circuit board. Thus, the electrical component is electrically connected to the printed circuit board. Since electronic components can be mounted to each side of the printed circuit board, the surface mounting structure allows high circuit density of the printed circuit board.

However, in the surface mounting structure, the terminals of the electronic component are placed on the lands of the printed circuit board and then soldered to the terminals in a reflow process. Therefore, the terminals may be displaced from the lands before the solder hardens. For example, the displacement may occur when the circuit board or the electronic component is deformed due to the difference in the linear coefficient of expansion between the circuit board and the electronic component. Further, it is difficult to ensure coplanarity of the lands because the number of the terminals is large. Therefore, the connection reliability between the terminals and the lands may be reduced.

SUMMARY OF THE INVENTION

In view of the above-described problem, it is an object of the present invention to provide an electronic component mounting structure for increasing circuit density and connection reliability.

An electronic component mounting structure includes a board and an electronic component mounted on a front surface of the board. The board includes a plurality of lands and the electronic component includes a body and a plurality of terminals extending from the body. Each of the terminals is electrically connected to a corresponding one of the lands of the board.

The terminals have a first terminal portion extending along the front surface of the board and a second terminal portion extending toward the front surface of the board. The lands include a land portion electrically soldered to the first terminal portion and a blind hole for receiving the second terminal portion. The blind hole has an opening on the front surface of the board and a bottom wall inside the board. Therefore, the blind hole does not penetrate through the board, i.e., the blind hole is not exposed to a back surface of the board.

The first terminal portion is soldered to the land portion in a reflow process under the condition that the second terminal portion is inserted in the blind hole. Thus, the second terminal portion serves an anchor for preventing the first terminal portion from being displaced from the land portion before solder hardens. Therefore, connection reliability between the terminals and the lands can be increased, i.e., between the electronic component and the board.

Since the blind hole is not exposed to the back surface of the board, other electronic components can be mounted to the back surface, directly beneath the blind hole. Therefore, the electronic components can be mounted to each side of the board so that circuit density of the board can be increased.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
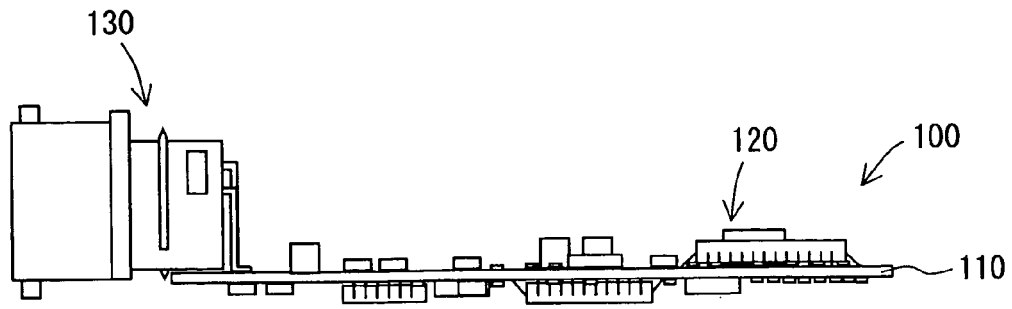
FIG. 1 is a side view of a board and an electronic component mounted to the board according to a first embodiment of the present invention.

As shown in FIG. 1, a circuit board 100 includes a board 110 and electronic components 120, 130 mounted to the board 110. The electronic component 130 is a connector and the electronic component 120 may be, for example, a microcomputer, a power transistor, a capacitor, a resistor, or the like. In this embodiment, the electronic component 130 has a mounting structure according to the present invention.

The board 110 may be, for example, a multilayer board having one or more inner layers in addition to outer layers.

Figure 2A:
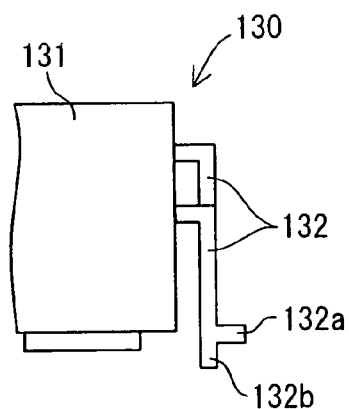
FIG. 2A is a side view of the electronic component of FIG. 1.
Figure 2B:
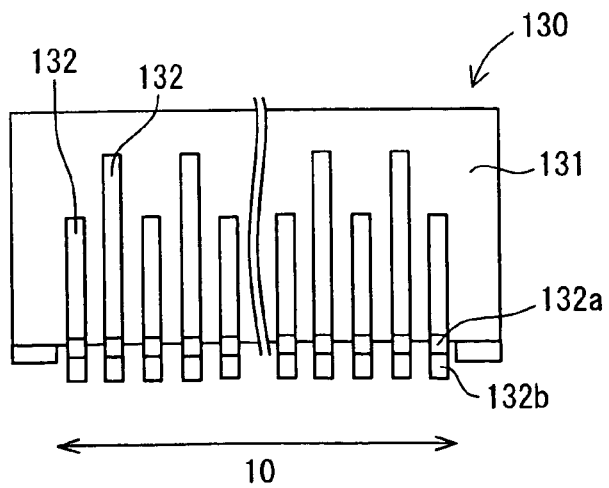
FIG. 2B is a front view of the electronic component of FIG. 1.

As shown in FIGS. 2A and 2B, the electronic component 130 includes a body 131 made of an electrically insulating material (e.g., synthetic resin) and first terminals 132 made of an electrically conducting material. The first terminals 132 are disposed into the body 131 such that the first terminals 132 are electrically insulated from each other. A first end of each first terminal 132 is exposed to a first surface of the body 131 and connected to a front surface of the board 110. A second end of each first terminal 132 is exposed to a second surface of the body 131 and connected to an external device.

As shown in FIG. 2B, the body 131 has a length in a direction 10 along the surface of the board 110. For example, the first terminals 132 project from the first surface of the body 131 at two different heights so that junctions between the first terminals 132 and the front surface of the body 131 form two lines in the length direction 10. Junctions between the first terminals 132 and the front surface of the board 110 form one line in the length direction 10.

Specifically, each first end of the first terminals 132 projects from the body 131 approximately parallel to the board 110 and is bent downward approximately perpendicular to the board 110. A tip of each first end is divided into first and second portions 132a, 132b. The first portion 132a extends approximately parallel to the front surface of the board 110 and the second portion 132b extends approximately perpendicular to the front surface of the board 110. Thus, the first portion 132a extends along the front surface of the board 110 and the second portion 132b extends toward the front surface of the board 110. The second portion 132b has a length smaller than a thickness of the board 110 so that the first terminals 132 are not exposed to a back surface of the board 110. Also, the length of the first and second portions 132a, 132b are set so that desired connection reliability between the first terminals 132 and the board 110 can be ensured.

Figure 3:
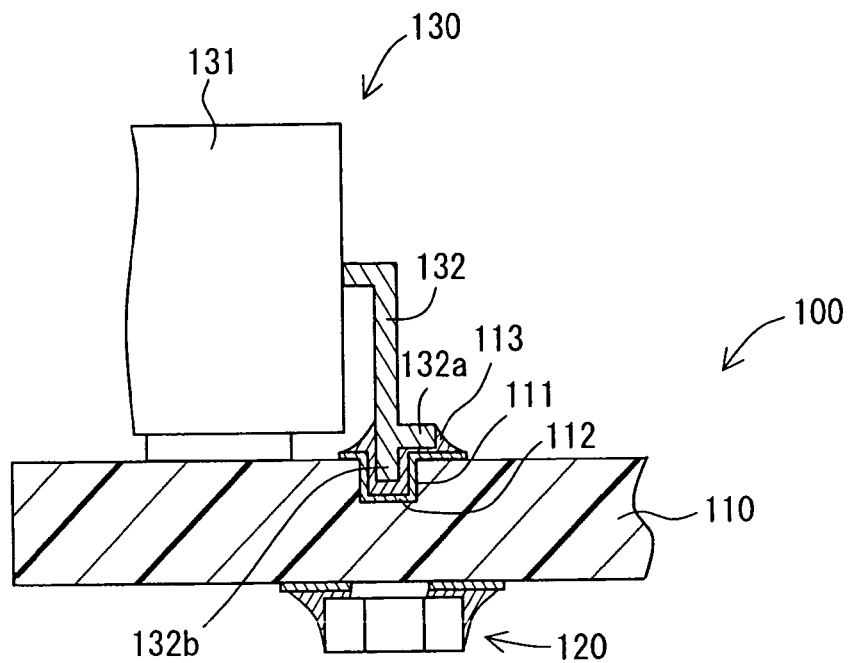
FIG. 3 is a cross-sectional view of connection area between the board and the electronic component of FIG. 1.

As shown in FIG. 3, the board 110 has blind holes 111 on the front surface. Each blind hole 111 receives a corresponding one of the second portions 132b. The blind hole 111 has an opening on a front surface and has a bottom inside the board 110. In short, the blind hole 111 has a depth smaller than the thickness of the board 110. Therefore, the blind hole 111 does not penetrate through the board 110 and is not exposed to the back surface of the board 110. The blind hole 111 is formed by a drill, a laser, or the like.

Lands 112 are formed on the front surface of the board 110. Each land 112 is electrically connected to a corresponding one of the first terminals 132. The land 112 is formed on an inner wall of the blind hole 111 and around the opening of the blind hole 111 by plating, etching, or the like. Alternatively, the land 112 may not be formed on the inner wall of the blind hole 111.

A solder paste 113 having a predetermined viscosity is placed on the land 112 by using a conventional screen printing process, a conventional solder dispenser, or the like.

The electronic component 130 is placed in a predetermined mounting location on the front surface of the board 110 such that the second portion 132b of the first terminal 132 is inserted in the blind hole 111. Thus, the first portion 132a comes in contact with the solder paste 113 around the opening of the blind hole 111 and the second portion 132b comes in contact with the solder paste 113 inside the blind hole 111.

The electronic component 130 can be easily placed in the mounting location on the board 110 by inserting the second portion 132b in the blind hole 111. Further, the second portion 132b serves as an anchor for preventing the electronic component 130 from being displaced from the mounting location in a direction along the front surface of the board 110.

A reflow process is performed under the condition that the electronic component 130 is placed in the mounting location on the board 110. The solder paste 113 melts and wets the first terminal 132 in the reflow process and then cools and hardens, preferably to form a proper solder fillet between the first terminal 132 and the land 112. Thus, the first terminal 132 is electrically and mechanically connected to the land 112 by the solder paste 113 so that the electronic component 130 can be electrically and mechanically connected to the board 110.

In the structure according to this embodiment, the first portion 132a may have poor contact with the solder paste 113 before the reflow process, because the first terminals 132 project from the body 131 at different heights. However, the reflow process is performed under the condition that the second portion 132b remains inserted in the blind hole 111. In the reflow process, the solder paste 113 melts and moves on the second portion 132b to the first portion 132a to properly wet the first portion 132a. Thus, contact area between the first terminal 132 and the solder paste 113 is increased so that connection reliability between the first terminal 132 and the land 112 can be ensured by the solder paste 113, even when the first portion 132a has poor contact with the solder paste 113 before the reflow process.

At least one of the board 110 and the body 131 of the electronic component 130 may be deformed in the reflow process due to a difference in the linear coefficient of expansion between the board 110 and the body 131. In a conventional surface mounting structure, therefore, the first portion 132a is displaced from the land 112 due to the deformation before the solder paste 113 hardens. As a result, the connection reliability between the first terminal 132 and the land 112 cannot be ensured. In contrast, in the structure according to this embodiment, the second portion 132b is inserted in the blind hole 111 and serves as the anchor. Thus, the second portion 132b prevents the first portion 132a from being displaced from the land 112 so that the connection reliability between the first terminal 132 and the land 112 can be ensured.

Each of the first and the second portions 132a, 132b is electrically and mechanically connected to the land 112 through the solder paste 113. Thus, the contact area between the first terminal 132 and the land 112 is increased compared to the conventional structure. The increased contact area allows a large current flow between the electronic component 130 and the board 110. Also, the electronic component 130 can be securely mounted to the board 110 because of the increased contact area.

Since the blind hole 111 is not exposed to the back surface of the board 110, the electronic component 120 is mounted to the back surface, directly beneath the blind hole 111. Thus, the electronic components 120, 130 can be mounted to each side of the board 110 so that circuit density of the board 110 can be increased. The electronic component 120 beneath the blind hole 111 can be mounted to the back surface after or before the electronic component 130 is mounted to the front surface.

As described above, the land 112 may not be formed on the inner wall of the blind hole 111. In this case, the second portion 132b inserted in the blind hole 111 is not electrically connected to the land 112. The first portion 132a is electrically connected to the land 112 around the opening of the blind hole 111 so that the electronic component 130 and the board 110 are electrically connected.

Second Embodiment

Figure 4:
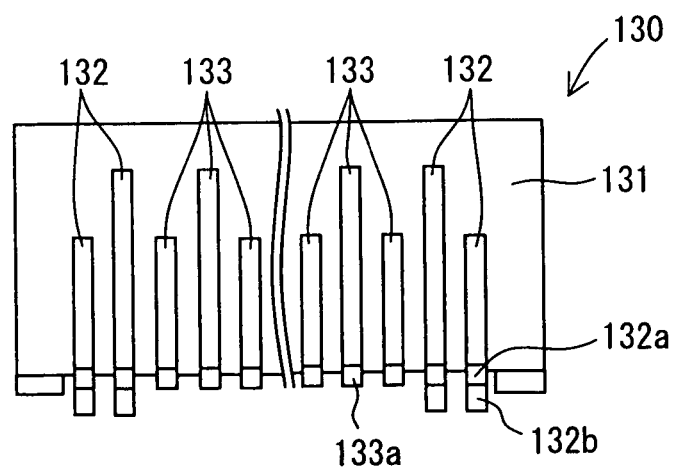
FIG. 4 is a front view of an electronic component according to a second embodiment of the present invention.
Figure 5A:
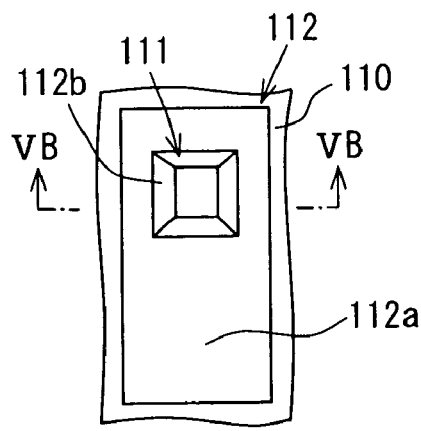
FIG. 5A is a plan view of a board according to a third embodiment of the present invention.
Figure 5B:
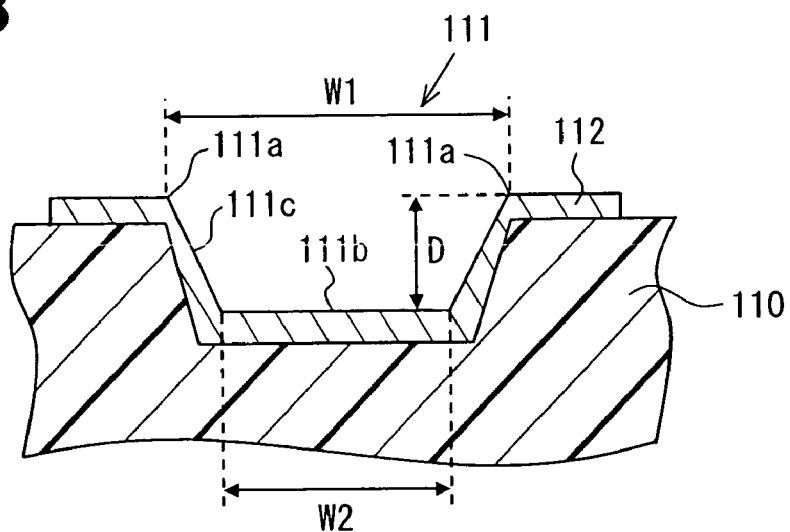
FIG. 5B is a cross-sectional view taken along line VB-VB in FIG. 5A.

The second embodiment is shown in FIG. 4. An electronic component 130 includes second terminals 133 in addition to the first terminals 132. Although each first terminal 132 has both the first portion 132a and the second portion 132b, each second terminal 133 has only a first portion 133a corresponding to the first portion 132a. Therefore, the board 110 has the blind hole 111 for the first terminal 132 and does not have the blind hole 111 for the second terminal 133. The board 110 has the land 112 for the second terminal 133 on the front surface. As with the first portion 132a, the first portion 133a extends along the front surface of the board 110 and comes in contact with the solder paste 113 on the land 112. In such an approach, the number of the blind holes 111 can be reduced so that wiring patterns of the board 110 can be designed more flexibly.

As shown in FIG. 4, the first terminals 132 are disposed on end side of the body 131 in the length direction 10, and the second terminals 133 are disposed on middle side of the body 131 in the length direction 10. Thus, the second terminals 133 are disposed between the first terminals 132 in the length direction 10.

As described above, the board 110 and the body 131 of the electronic component 130 may be deformed in the reflow process due to the difference in the linear coefficient of expansion between the board 110 and the body 131. The deformation reduces the connection reliability between the electronic component 130 and the board 110. The degree of the deformation is large on end side of the body 131 in the length direction 10. According to the second embodiment, the first terminals 132 having the second portion 132b, which serves as the anchor, are disposed on end side of the body 131. In such an approach, the number of the blind holes 111 can be reduced without reducing the connection reliability between the electronic component 130 and the board 110. Therefore, the wiring patterns of the board 110 can be designed more flexibly.

Third Embodiment

The third embodiment of the present invention is shown in FIGS. 5A-6B. In the third embodiment, the solder paste 113 is placed on the land 112 by the screen printing process.

The first portion 132a of the first terminal 132 is connected to a first portion 112a of the land 112 through the solder paste 113. The first portion 112a of the land 112 is formed around the opening of the blind hole 111. The second portion 132b of the first terminal 132 is connected a second portion 112b of the land 112 through the solder paste 113. The second portion 112b of the land 112 is formed on the inner wall of the blind hole 111. The blind hole 111 has a taper shape, at least after the land 112 is formed on the inner wall of the blind hole 111.

Specifically, after the land 112 is formed on the inner wall of the blind hole 111, the blind hole 111 has an approximately square opening defined by an edge portion 111a and an approximately square bottom wall 111b. The opening has a first width W1 and the bottom wall 111b has a second width W2 smaller than the first width W1. A side wall 111c connecting the edge portion 111a and the bottom wall 111b forms an obtuse angle with the bottom wall 111b. Thus, the blind hole 111 has the taper shape and decreases in width toward the bottom wall 111b.

Figure 6A:
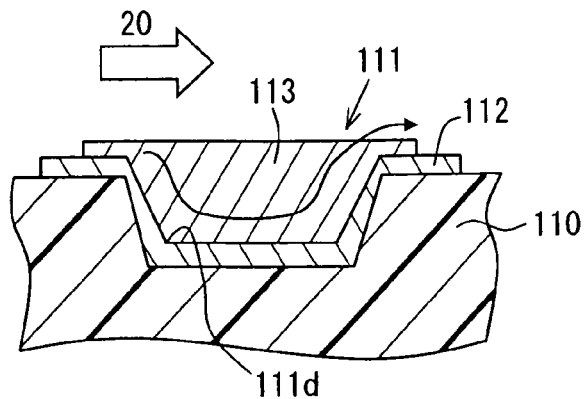
FIGS. 6A and 6B are cross-sectional views showing air flow in a blind hole of the board according to the third embodiment.
Figure 6B:
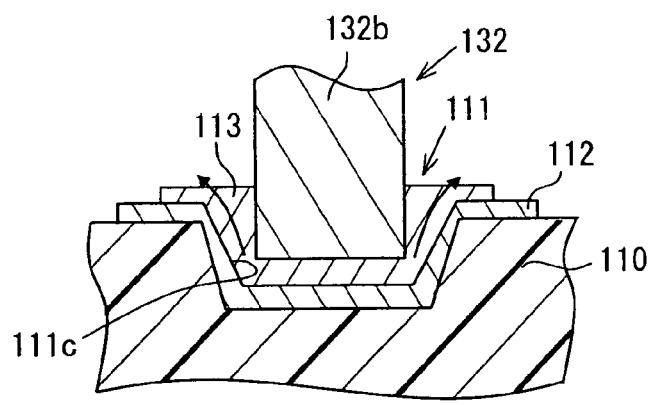

In the screen printing process, a squeegee (not shown) moves in a direction 20 shown in FIG. 6A to place the solder paste 113 on the land 112. According to the third embodiment, the blind hole 111 has the taper shape such that the side wall 111c forms the obtuse angle with the bottom wall 111b. Therefore, the solder paste 113 can easily reach a corner portion 111d of the blind hole 111. Thus, as indicated by a directional arrow in FIG. 6A, the air is pushed out of the blind hole 111 by the solder paste 113 so that the air remaining in the solder paste 113 after the screen printing process can be reduced. Further, the second portion 132b of the first terminal 132 can be easily inserted in the blind hole 111, because the first width W1 of the opening of the blind hole 111 is larger than the second width W2 of the bottom wall 111b of the blind hole 111. Furthermore, since a distance between the side wall 111c and the second portion 132b is large, the air remaining in the solder paste 113 can escape out of the blind hole 111 in the reflow process, as indicated by a directional arrow in FIG. 6B. Thus, a void in the solder paste 113 can be reduced so that the second portion 132b and the land 112 can be securely and reliably connected by the solder paste 113.

Figure 6C:
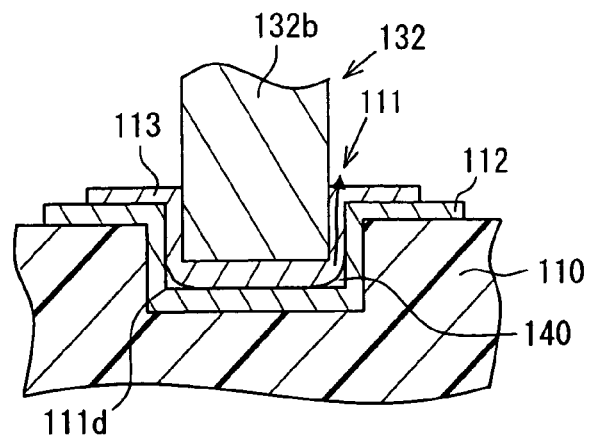
FIG. 6C is a cross-sectional view showing air flow in a blind hole of the board according to the first embodiment.

In contrast, if the blind hole 111 does not have the taper shape, the solder paste 113 cannot reach the corner portion 111d. As shown in FIG. 6C, therefore, the air remains in the blind hole 111 and a space 140 is formed at the corner portion 111d after the screen printing process. As a result, the solder paste 113 contains a relatively large amount of air. Further, since the distance between the side wall 111c and the second portion 132b of the first terminal 132 is small, most of the air contained in the solder paste 113 cannot escape out of the blind hole 111 in the reflow process, as indicated by a directional arrow in FIG. 6C. Therefore, the void in the solder paste 113 is increased so that the connection reliability between the second portion 132b and the land 112 is reduced due to the void.

According to the third embodiment, the blind hole 111 has the taper shape, at least after the land 112 is formed on the inner wall of the blind hole 111. Specifically, the first width W1 of the opening of the blind hole 111 is larger than the second width W2 of the bottom wall 111b of the blind hole 111. As the blind hole 111 is deep, the air in the blind hole 111 is large. As a result, if the blind hole 111 is deep, it is likely that the air remains in the solder paste 113 after the screen printing process. Further, if the blind hole 111 is deep, it is unlikely that the air remaining in the solder paste 113 escapes out of the blind hole 111 in the reflow process. Therefore, it is preferable that a depth D of the blind hole 111 is smaller than the first width W1. It is more preferable that the depth D is smaller than the second width W2. In such an approach, the void in the solder paste 113 can be reduced so that the second portion 132b and the land 112 can be securely and reliably connected by the solder paste 113.

In FIGS. 5A-6B, the blind hole 111 has the taper shape, before and after the land 112 is formed on the inner wall of the blind hole 111. In short, the blind hole 111 has the taper shape by itself. In this case, the blind hole 111 can be formed by the laser.

Figure 7:
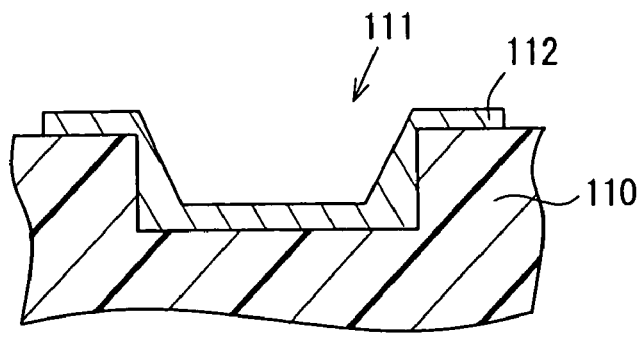
FIG. 7 is a cross-sectional view of a board according to a modification of the third embodiment.

Alternatively, as shown in FIG. 7, the blind hole 111 may have the taper shape, only after the land 112 is formed on the inner wall of the blind hole 111 by plating (e.g., electroless plating followed by electroplating). In short, the blind hole 111 may not have the taper shape by itself. In this case, the blind hole 111 can be formed by the drill. Therefore, cost of forming the blind hole 111 can be reduced by using the drill instead of the laser.

Figure 8A:
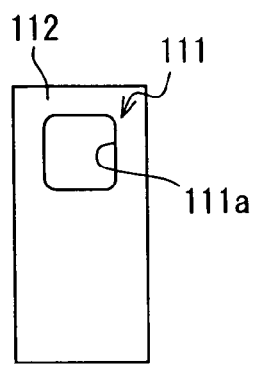
FIGS. 8A and 8B are plan views of blind holes according to a modification of the third embodiment.
Figure 8B:
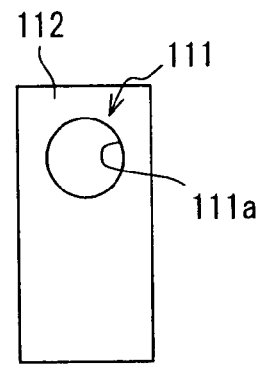

According to the third embodiment, the blind hole 111 has the approximately square opening defined by the edge portion 111a. Alternatively, as shown in FIGS. 8A and 8B, the blind hole 111 may have a square opening with rounded corners or a circular opening. In such an approach, the solder paste 113 can reach the corner portion 111d of the blind hole 111 more easily so that the air remaining in the solder paste 113 after the screen printing process can be reduced.

Figure 9A:
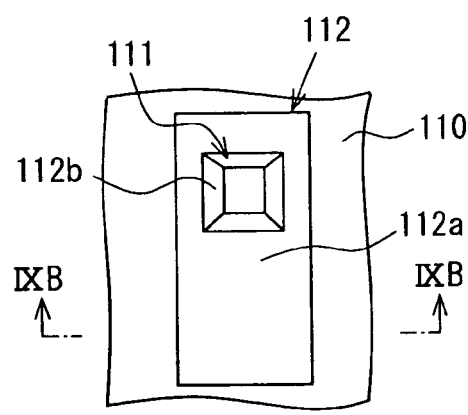
FIG. 9A is a plan view of a board according to a modification of the third embodiment.
Figure 9B:
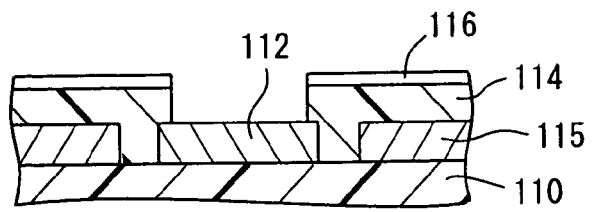
FIG. 9B is a cross-sectional view taken along line IXB-IXB in FIG. 9A.

In the third embodiment, at least one of a ground pattern, a wiring pattern electrically connected to the land 112, a dummy-wiring pattern, and a silk pattern may be placed around the land 112. For example, as shown in FIGS. 9A and 9B, a ground pattern 115 and a silk pattern 116 may be laminated with a resist 114 at least around the first portion 112a of the land 112. The first portion 112a and the ground pattern 115 can be formed in the same manufacturing process (e.g., process for etching a copper foil). The silk pattern 116 and other silk patterns (e.g., manufacturing lot number) can be formed in the same manufacturing process, after the resist 114 is formed. In such an approach, a thick protection layer can be provided around the land 112. Accordingly, the amount (i.e., thickness) of the solder paste 113 placed on the land 112 can be increased. Thus, the solder paste 113 can securely and reliably connect the electronic component 130 and the board 110.

Figure 10A:
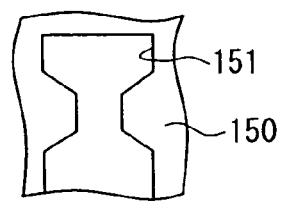
FIG. 10A is a plane view of a screen used in a screen printing process.
Figure 10B:
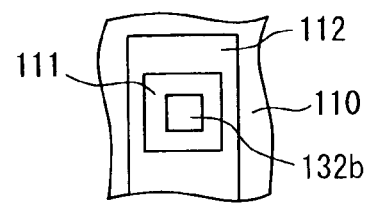
FIG. 10B is a plane view showing a positional relationship between a land and a terminal.
Figure 11A:
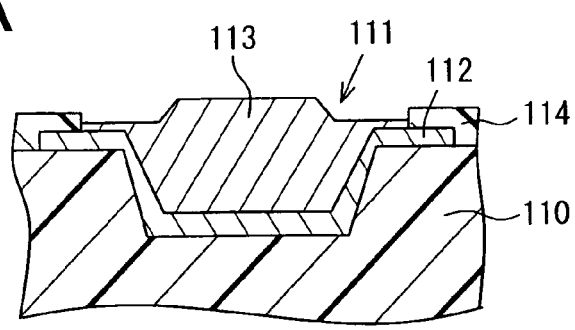
FIG. 11A is a cross sectional view of a blind hole that is filled with a solder paste by using the screen of FIG. 10A.
Figure 11B:
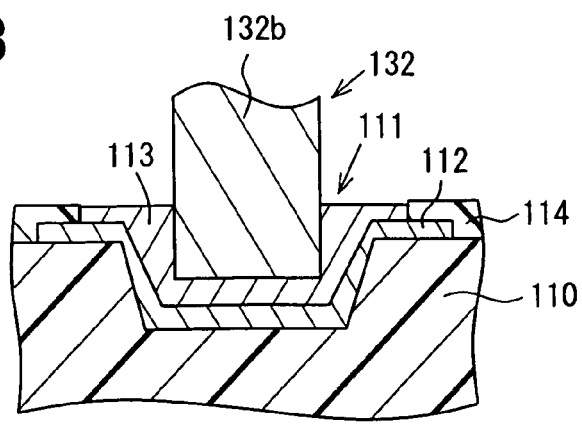
FIG. 11B is a cross sectional view of the blind hole of FIG. 11A after the terminal is inserted in the blind hole.

The screen-printing process may be performed by using a screen 150 shown in FIG. 10A. As can be seen from FIGS. 10A and 10B, the screen 150 has an opening 151 corresponding to the land 112. The opening 151 has a narrow portion that corresponds to a region where the second portion 132b is inserted in. As shown in FIG. 11A, the solder paste 113 can be placed on the land 112 by using the screen 150 such that the thickness of the solder paste 113 can be reduced around the region. As shown in FIG. 11B, thus, it is unlikely that the solder paste 113 extends off the land 112 (e.g., extends on the resist 114), after the second portion 132b is inserted in the blind hole 111 filled with the solder paste 113. Therefore, solder bridge can be reduced by placing the solder paste 113 on the land 112 using the screen 150.

Fourth Embodiment

Figure 12A:
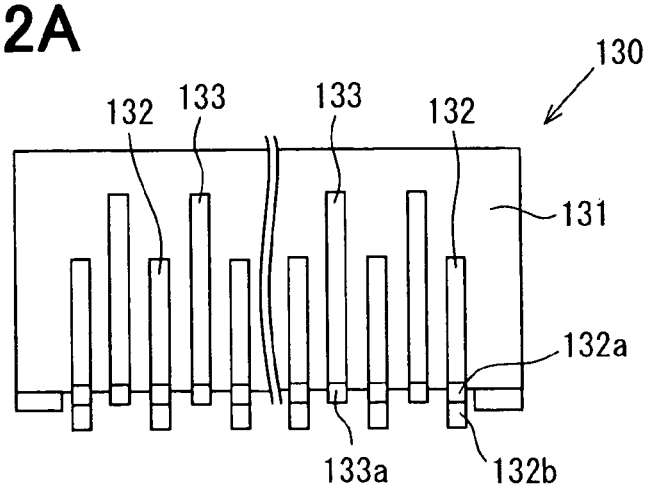
FIG. 12A is a front view of an electronic component according to a fourth embodiment of the present invention.
Figure 12B:
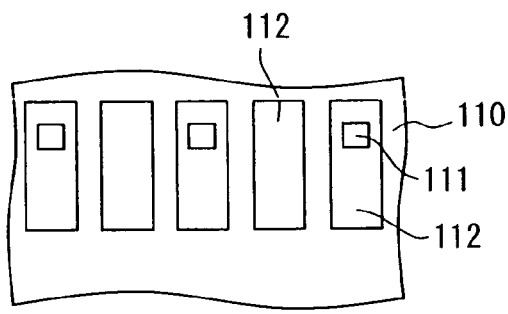
FIG. 12B is a plane view of a board according to the fourth embodiment.

The fourth embodiment of the present invention is shown in FIGS. 12A and 12B. An electronic component 130 includes the first terminal 132 and the second terminal 133. As descried previously, the first terminal 132 has both the first portion 132a and the second portion 132b, and the second terminal 133 has only the first portion 133a corresponding to the first portion 132a of the first terminal 132.

As shown in FIG. 12A, the first terminal 132 and the second terminal 133 are alternately arranged in the length direction 10 of the body 131 of the electronic component 130. Accordingly, as shown in FIG. 12B, the blind hole 111 for receiving the second portion 132b is alternately formed on the board 110 in the length direction 10. Thus, in the forth embodiment, the connection reliability between the electronic component 130 and the board 110 can be ensured, as compared to in the second embodiment. Also, in the fourth embodiment, the number of the blind holes 111 can be reduced so that the wiring patterns of the board 110 can be designed flexibly, as compared to in the first embodiment.

Fifth Embodiment

Figure 13:
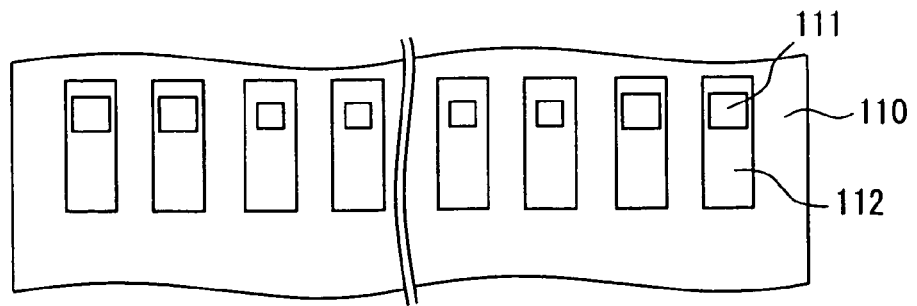
FIG. 13 is a plane view of a board according to a fifth embodiment of the present invention.

The fifth embodiment of the present invention is shown in FIG. 13. An electronic component 130 includes only the first terminal 132. A blind hole 111 arranged on end side of the board 110 has an opening larger than that of a blind hole 111 arranged on middle side of the board 110.

As described above, the board 110 and the body 131 of the electronic component 130 may be deformed in the reflow process due to the difference in the linear coefficient of expansion between the board 110 and the body 131. The deformation reduces the connection reliability between the electronic component 130 and the board 110. The degree of the deformation is large on end side of the body 131 in the length direction 10.

According to the fifth embodiment, the blind hole 111 arranged on end side has the opening larger than that of the blind hole 111 arranged on middle side. In such an approach, even if the deformation occurs, the second portion 132b on end side can remain inserted in the blind hole 111. Thus, the second portion 132b can serve the anchor for preventing the first portion 132a from being displaced from the land 112. Therefore, the connection reliability between the first terminal 132 and the land 112 can be ensured.

The land 112 on end side is easily damaged by a temperature change. In the fifth embodiment, since the blind hole 111 on end side has the large opening, the amount of the solder paste 113 in the blind hole 111 on end side is large. The large amount of the solder paste 113 protects the land 112 on end side from being damaged by the temperate change. Therefore, the connection reliability between the first terminal 132 and the land 112 can be ensured.

Sixth Embodiment

Figure 14A:
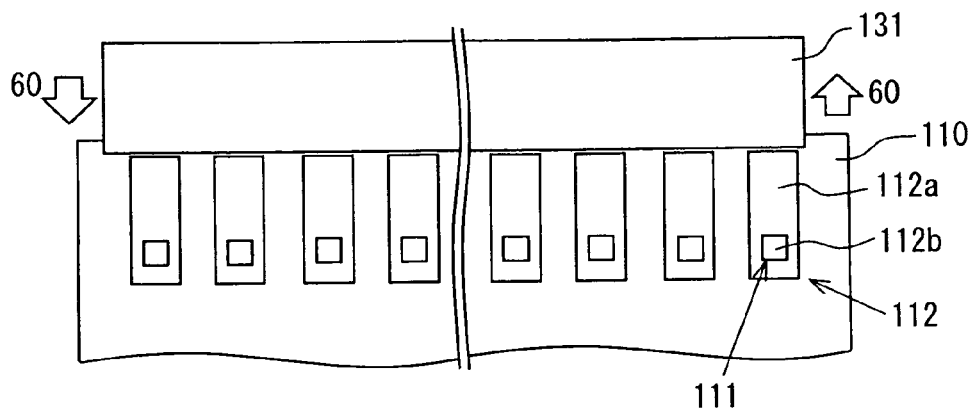
FIG. 14A is a plane view of a board according to a sixth embodiment of the present invention.
Figure 14B:
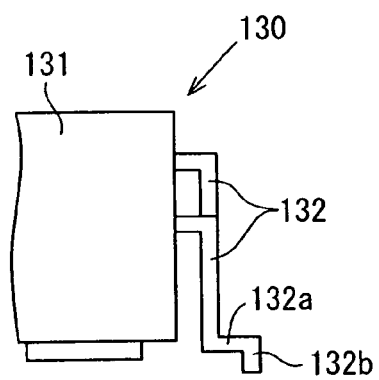
FIG. 14B is a side view of an electronic component according to the sixth embodiment.

The six embodiment of the present invention is shown in FIGS. 14A-14B. An electronic component 130 includes only the first terminal 132.

In the above-described embodiments, as shown in FIG. 2B, the second portion 132b extends from the root of the first portion 132a. Accordingly, as shown in FIG. 14C, the first portion 112a of the land 112 is formed on the side far from the body 131 and the second portion 112b of the land 112 is formed on the side near to the body 131.

In contrast, in the sixth embodiment, as shown in FIG. 14B, the second portion 132b extends from the tip of the first portion 132a. Accordingly, as shown in FIG. 14A, the first portion 112a of the land 112 is formed on the side near to the body 131 and the second portion 112b of the land 112 is formed on the side far from the body 131. In such an approach, a distance between the body 131 and the blind hole 111 can be increased compared to the above-described embodiments.

When rotational stress indicated by a directional arrow 60 of FIG. 14A is applied to the electronic component 130, the second portion 132b of the first terminal 132 may be displaced from the second portion 112b of the land 112. Increasing the distance between the body 131 and the blind hole 111 can efficiently reduce the displacement due to the rotational stress. According to the sixth embodiment, therefore, the displacement due to the rotational stress can be reduced.

Figure 14C:
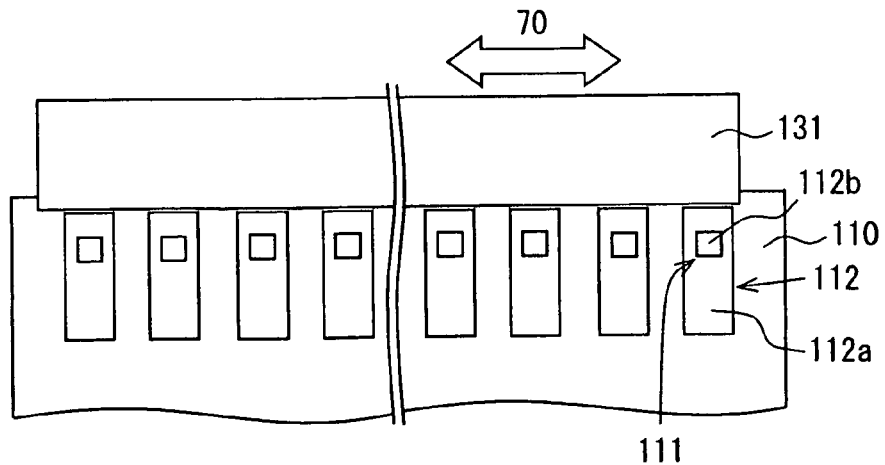
FIG. 14C is a plane view of the board according to the first embodiment.

When longitudinal stress indicated by a directional arrow 70 of FIG. 14C is applied to the electronic component 130, the second portion 132b of the first terminal 132 may be displaced from the second portion 112b of the land 112. Reducing the distance between the body 131 and the blind hole 111 can efficiently reduce the displacement due to the longitudinal stress. According to the above-described embodiments, therefore, the displacement due to the longitudinal stress can be reduced.

Figure 15A:
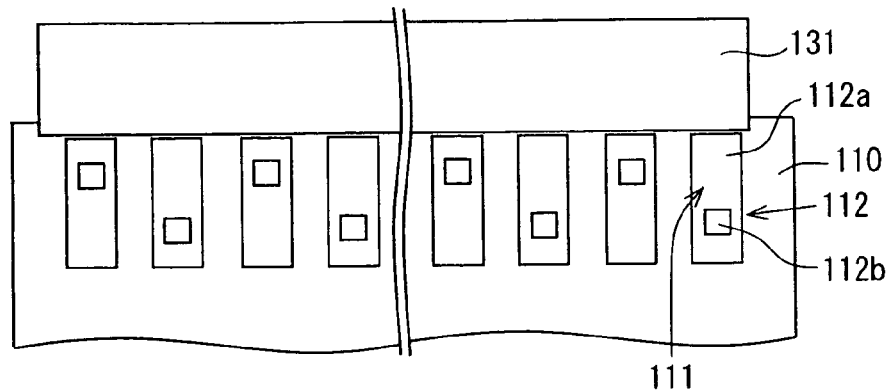
FIG. 15A is a plane view of a board according to a modification of the sixth embodiment.
Figure 15B:
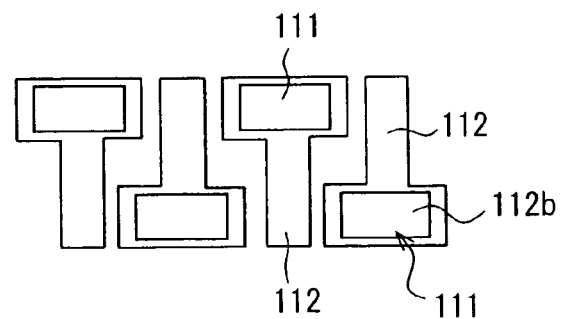
FIG. 15B is an enlarged view of FIG. 15A.

Alternatively, as shown in FIG. 15A, the land 112 having the first portion 112a on the side near to the body 131 and the land 112 having the first portion 112a on the side far from the body 131 are alternately arranged in the length direction 10. In such an approach, both the displacement due to the longitudinal stress and the displacement due to rotational stress can be effectively reduced. Further, as shown in FIG. 15B, the opening of the blind hole 111 can be increased by the alternate arrangement. Thus, it is unlikely that the second portion 132b of the first terminal 132 is displaced from the second portion 112b of the land 112 even if the displacement occurs. Therefore, the connection reliability between the first terminal 132 and the land 112 can be ensured.

Seventh Embodiment

Figure 16A:
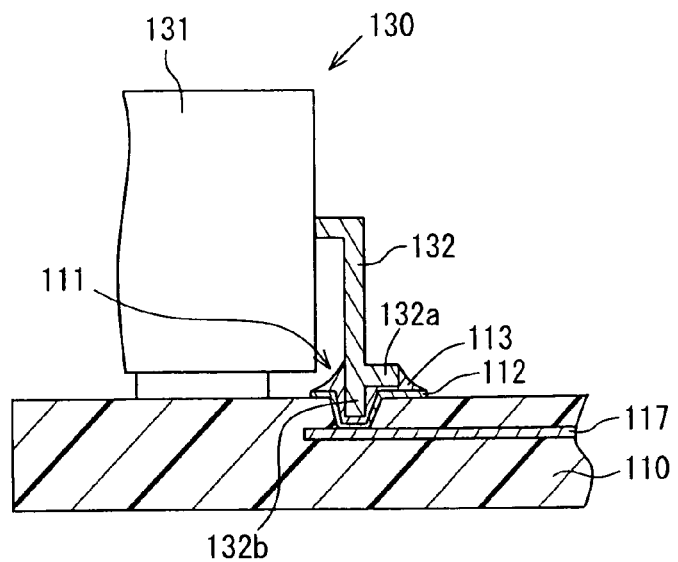
FIG. 16A is a cross-sectional view of connection area between a board and an electronic component according to a seventh embodiment of the present invention.
Figure 16B:
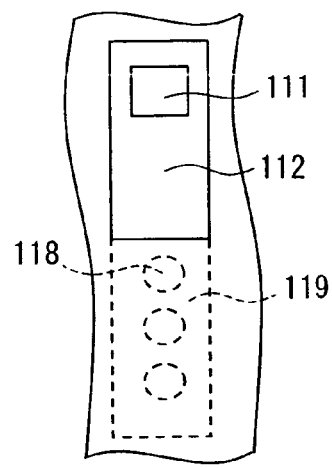
FIG. 16B is a plane view of the board of FIG. 16A.

The seventh embodiment of the present invention is shown in FIGS. 16A and 16B. A board 110 is a multi-layer board having an inner wiring layer 117. As shown in FIG. 16A, the inner wiring layer 117 is used as a bottom wall of the blind hole 111. In such an approach, when the second portion 132b is inserted in the blind hole 111, the first terminal 132 can be electrically connected to the inner wiring layer 117 through the land 112 and the solder paste 113.

If the inner wiring layer 117 is not used as the bottom wall of the blind hole 111, a via hole 118 and a wiring pattern 119 shown in FIG. 16B are needed to electrically connect the inner wiring layer 117 and the first terminal 132.

According to the seventh embodiment, the inner wiring layer 117 is used as the bottom wall of the blind hole 111. Thus, the circuit density of the board 110 can be increased by eliminating the via-hole 118 and the wiring pattern 119 from the board 110. Further, the wiring pattern of the board 110 can be designed more flexibly by eliminating the via-hole 118 and the wiring pattern 119 from the board 110. Further, since an electrical current can be directly transmitted between the first terminal 132 and the inner wiring layer 117, a large current can be transmitted between the electronic component 130 and the board 110.

Eighth Embodiment

Figure 17:
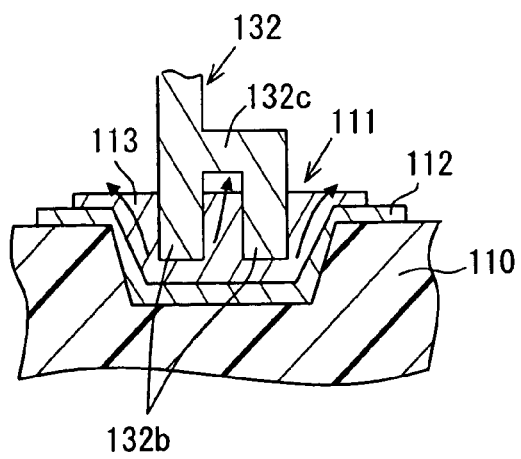
FIG. 17 is a cross-sectional view of connection area between a board and an electronic component according to an eighth embodiment of the present invention.

The eighth embodiment of the present invention is shown in FIG. 17. A first terminal 132 does not have the first portion 132a and has two second portions 132b and a joint portion 132c. The two second portions 132b are spaced from each other in the direction along the surface of the board 110 and joined together by the joint portion 132c. The two second portions 132b are inserted in the same blind portion 111. In such an approach, contact area between the first terminal 132 and the solder paste 113 is increased inside the blind hole 111 so that the connection reliability between the first terminal 132 and the land 112 can be increased.

Further, as indicated by a directional arrow in FIG. 17, the air in the solder paste 113 can easily escape from the blind hole 111 via space between the second portions 132b in the reflow process. Thus, the land 112 and the second portions 132b can be securely and reliably connected by the solder paste 113.

As shown in FIG. 17, the joint portion 132c has no contact with the solder paste 113. In such an approach, the air can easily escape from the blind hole 111 via space under the joint portion 132c. Alternatively, the joint portion 132 may have contact with the solder paste 113. In such an approach, the contact area between the first terminal 132 and the solder paste 113 is increased so that the connection reliability between the first terminal 132 and the land 112 can be increased.

Figure 18A:
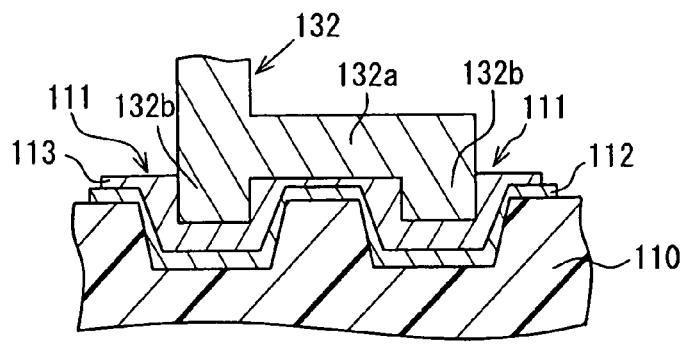
FIG. 18A is a cross-sectional view of connection area between a board and an electronic component according to a modification of the eighth embodiment.
Figure 18B:
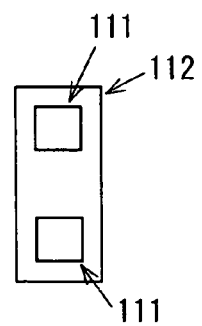
FIG. 18B is a plane view of a land of the board of FIG. 18A.

According to the eighth embodiment, the two second portions 132b are inserted in the same blind hole 111. Alternatively, as shown in FIGS. 18A and 18B, the two second portions 132b are inserted different blind holes 111 that are electrically connected to each other by the land 112. In such an approach, the opening of the blind hole 111 can have a reduced width as compared to the case where the two second portions 132b are inserted in the same blind hole 111. Therefore, the cost of forming the blind hole 111 (especially, by the laser) can be reduced.

As shown in FIG. 18A, the two second portions 132b are joined together by the first portion 132a, instead of the joint portion 132c shown in FIG. 17. In such an approach, the structure of the first terminal 132 can be simplified.

(Modifications)

The embodiments described above may be modified in various ways. For example, the number of the first portions 132a and the second portions 132b included in each first terminal 132 can be variable. For example, each first terminal 132 may have two first portion 132a and one second portion 132b.

Figure 19:
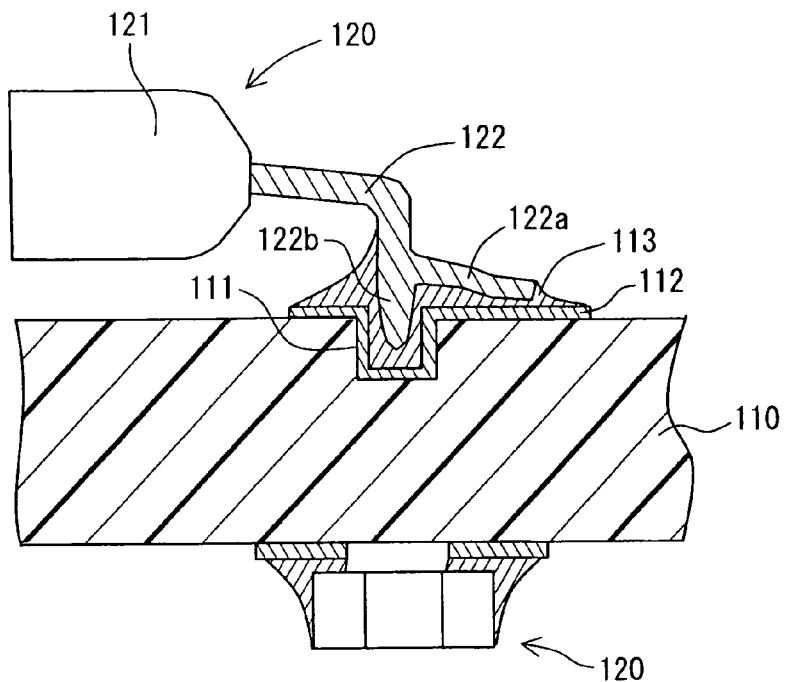
FIG. 19 is a cross-sectional view of connection area between a board and an electronic component according to a modification of the present invention.

In addition to or instead of the electronic component 130 as the connector, the electronic component 120 (e.g., microcomputer) may have the mounting structure according to the present invention. As shown in FIG. 19, the electronic component 120 has a body 121 and a terminal 122 having a first portion 122a and a second portion 122b. The first portion 122a extends along the surface of the board 110 and the second portion 122b extend toward the surface of the board 110. The first portion 122a is connected to the land 112 by the solder paste 113 around the opening of the blind hole 111 and the second portion 122b is inserted in the blind hole 111 and connected to the land 122 by the solder paste 113 inside the blind hole 111. Another electronic component 120 can be mounted to the back surface of the board 110, directly beneath the blind hole 111.

In the above-described embodiments, the first terminal 132 is exposed to one surface of the body 131. Alternatively, the first terminal 132 may be exposed to multiple surfaces of the body 131 and connected to the board 110 by means of the mounting structure according to the present invention.

Figure 20:
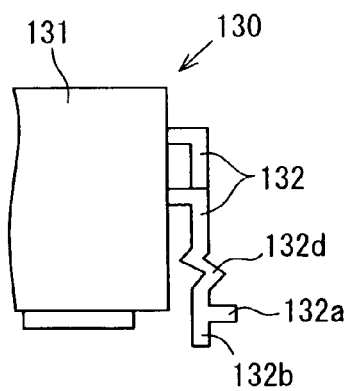
FIG. 20 is a side view of an electronic component according to a modification of the present invention.

As shown in FIG. 20, the first terminal 132 may include a spring portion 132d between the body 131 and the first and second portions 132a, 132b. The spring portion 132b is elastically deformed to absorb stress that is applied to the first terminal 132 and caused by the deformation of the board 110 and the body 131 due to the temperature change. Thus, the first terminal 132 can be prevented from being displaced from the land 112 in the reflow process. Therefore, the connection reliability between the first terminal 132 and the land 112 can be ensured. Further, the spring portion 132b absorbs external stress applied to the junction between the first terminal 132 and the land 112, after the electronic component 130 is mounted to the board 110. Thus, the connection reliability between the first terminal 132 and the land 112 can be ensured.

Figure 21:
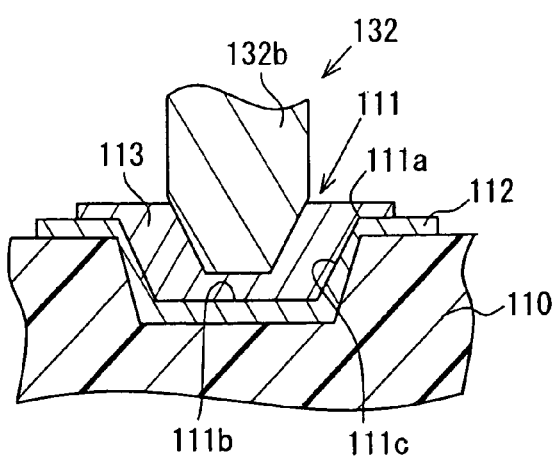
FIG. 21 is a cross-sectional view of connection area between a board and an electronic component according to a modification of the present invention.

As shown in FIG. 21, when the blind hole 111 has the taper shape and decreases in width toward the bottom wall, the second portion 132b may also have the taper shape and decreases in width toward its tip. In such an approach, the second portion 132b can be easily inserted in the blind hole 111.

Such changes and modifications are to be understood as being within the scope of the present invention as defined by the appended claims.

What is claimed is:

1. An electronic component mounting structure comprising:
   a board including a plurality of lands and a plurality of holes; and
   an electronic component mounted on a surface of the board, the electronic component including a body and a plurality of terminals extending from the body and electrically connected to a corresponding land,
   wherein each land is disposed on the surface of the board around an opening of a corresponding hole,
   wherein the plurality of holes includes first and second holes, the first hole being spaced by a first distance from the body in a first direction, the second hole being spaced by a second distance less than the first distance from the body in the first direction,
   wherein the plurality of terminals includes first and second terminals,
   wherein each of the first and second terminals includes a first terminal portion extending along the surface of the board and a second terminal portion branching from the first terminal portion and extending toward the surface of the board,
   wherein the first terminal portion is soldered to the corresponding land,
   wherein the second terminal portion of the first terminal is received in the first hole, and
   wherein the second terminal portion of the second terminal is received in the second hole.

2. The structure according to claim 1, wherein the first and second holes are alternately arranged in a second direction along the body of the electronic component.

3. The structure according to claim 2, wherein the first direction is substantially orthogonal to the second direction.

4. The structure according to claim 2, wherein a width of the opening of the hole in the second direction is greater than a width of the corresponding land in the second direction.

5. A circuit board on which an electronic component is mounted, the circuit board comprising:
   a board;
   a plurality of holes for receiving terminals of the electronic component, each hole having an opening on a surface of the board; and
   a plurality of lands electrically connected to the terminals of the electronic component, each land being disposed around the opening of a corresponding hole,
   wherein the plurality of holes includes a plurality of first holes and a plurality of second holes,
   wherein the plurality of first holes is arranged in a first line in a predetermined direction, and
   wherein the plurality of second holes is arranged in a second line parallel to the first line,
   wherein the first and second lines are not the same, and
   wherein each land has the same size and is located at the same distance from a body of the electronic component.

6. The structure according to claim 5, wherein the first and second holes are alternately arranged in the direction.

7. The circuit according to claim 6, wherein a width of each hole in the direction is greater than a width of the corresponding land in the direction.

* * * * *